United States Patent [19]

Stephens

[11] Patent Number: 5,416,403
[45] Date of Patent: May 16, 1995

[54] CURRENT STABILIZING CIRCUIT

[75] Inventor: Charles S. Stephens, Corvallis, Oreg.

[73] Assignee: Hewlett-Packard Corporation, Palo Alto, Calif.

[21] Appl. No.: 17,215

[22] Filed: Feb. 11, 1993

[51] Int. Cl.$^6$ .............................................. G05F 1/10
[52] U.S. Cl. .................................................. 323/222
[58] Field of Search ............... 323/222, 232, 265, 266, 323/271, 273, 282, 290, 299, 303; 307/52, 60, 61, 71

[56] References Cited

U.S. PATENT DOCUMENTS

| | | | |
|---|---|---|---|
| 3,723,285 | 3/1973 | Daga et al. | 204/99 |
| 3,852,652 | 12/1974 | Jasinski | 320/30 |
| 3,940,679 | 2/1976 | Brandwein et al. | 320/48 |
| 4,333,149 | 6/1982 | Taylor et al. | 364/481 |
| 4,416,957 | 11/1983 | Goebel et al. | 429/196 |
| 4,463,307 | 7/1984 | Kiko et al. | 323/356 |
| 4,622,508 | 11/1986 | Matteau et al. | 320/13 |
| 4,644,245 | 2/1987 | Brown | 320/13 |
| 4,737,702 | 4/1988 | Koenck | 320/40 |
| 4,801,859 | 1/1989 | Dishner | 323/222 |
| 5,097,051 | 6/1991 | Lafferty | 323/222 |
| 5,097,196 | 3/1992 | Schoneman | 323/222 |
| 5,146,399 | 9/1992 | Gucyski | 363/89 |
| 5,293,111 | 3/1994 | Weinberg | 323/222 |
| 5,321,348 | 6/1994 | Vinciarelli et al. | 323/222 |

FOREIGN PATENT DOCUMENTS 2648380  4/1978  Germany ............... H01M 6/50

OTHER PUBLICATIONS

"An Evaluation of Commercial Battery Discharge Indicators", M. L. Whitehead, Apr. 1981, 60 pp., ERA Technology Limited, Surrey, England.

*Primary Examiner*—Steven L. Stephan
*Assistant Examiner*—Matthew V. Nguyen

[57] ABSTRACT

A circuit topology useable in a battery impedance tester to latch a source current to a constant magnitude includes an inductor, a comparator, a driver and a storage capacitor. The inductor is connected in series with a current path between a source and a load. The inductor produces a voltage drop that changes with current drawn by the load. Responsive to the voltage drop, the driver provides the load with current supplied from the storage capacitor. The current provided by the driver returns the source current to the constant magnitude.

13 Claims, 4 Drawing Sheets

CURRENT STABILIZING CIRCUIT

FIELD OF THE INVENTION

The present invention relates generally to circuits for stabilizing a current to a load and to circuits for measuring the impedance of a battery.

BACKGROUND AND SUMMARY OF THE INVENTION

Battery impedance measurements can be a useful indicator of a number of battery characteristics. Accurate battery impedance measurements are thus important in many applications.

One methodology for measuring the impedance of a battery involves pulsing the battery with a current of known magnitude. The pulse can be either injected into or drawn from the battery. The voltage of the battery is measured during pulsing and also before or after pulsing. The battery impedance can then be determined by dividing the difference between the battery voltage measurements by the magnitude of the current pulse. However, for this battery impedance measurement methodology to be accurate, any other current being drawn from or applied to the battery must remain constant. Also, no part of the current pulse can be diverted to a load connected to the battery.

To insure the accuracy of a battery impedance test, the battery can be removed from its load (the circuit drawing energy from the battery). However, in many applications, it is impractical to disconnect the battery from its load to perform a battery impedance test. For example, with portable computing devices such as palmtop computers, the battery is constantly in use providing power to memory or clock circuits. The battery cannot be removed without disrupting these activities and losing any data stored in the memory circuits, as well as halting execution of any program currently in use.

Another possibility is to connect an isolating circuit or element between the battery and load. However, known isolating circuits have been found to be impractical for this purpose. In portable computing device applications, for example, it is necessary to maintain a low impedance path between the battery and the load in order to maximize the useful life of the battery and to provide reliable start-up characteristics. Conventional isolating devices fail to maintain a low impedance path between the battery and load, thus shortening useful battery life. Also, active switching devices are difficult to control during start-up. Therefore, these devices are unsuitable for battery impedance testing in such applications.

The present invention provides a circuit topology for stabilizing or latching the current provided by a battery to a load at a constant magnitude. In a preferred embodiment, the circuit topology comprises an inductor connected in series between the battery and the load. The inductor's terminals are connected to the inputs of a comparator to sense a difference in voltage between the terminals indicative of a change in the current drawn from the battery by the load (the inductor current). The comparator output is applied to a current driver circuit supplied from a storage capacitor. Responsive to the comparator output, the driver circuit provides an additional current to the load to return the current drawn from the battery to its latched magnitude. Latching of the inductor current can be enabled or disabled by a current switch connected between the storage capacitor and the current driver.

The circuit topology has particular application to measuring battery impedance. When the circuit is enabled, the current provided by the battery to the load is latched at a constant magnitude. Thereafter, a current pulse applied to the battery is prevented from diversion to the load. Thus, the impedance of the battery can be accurately measured while in-circuit and operating. Further, since a small value of inductance is sufficient for operation of the circuit, the series impedance between the battery and the load remains low and start-up characteristics are not affected significantly.

Additional features and advantages of the present invention will be made apparent from the following detailed description of a preferred embodiment, which proceeds with reference to the accompanying drawings.

DETAILED DESCRIPTION OF THE PREFERRED EMBODIMENT

Figure 1:
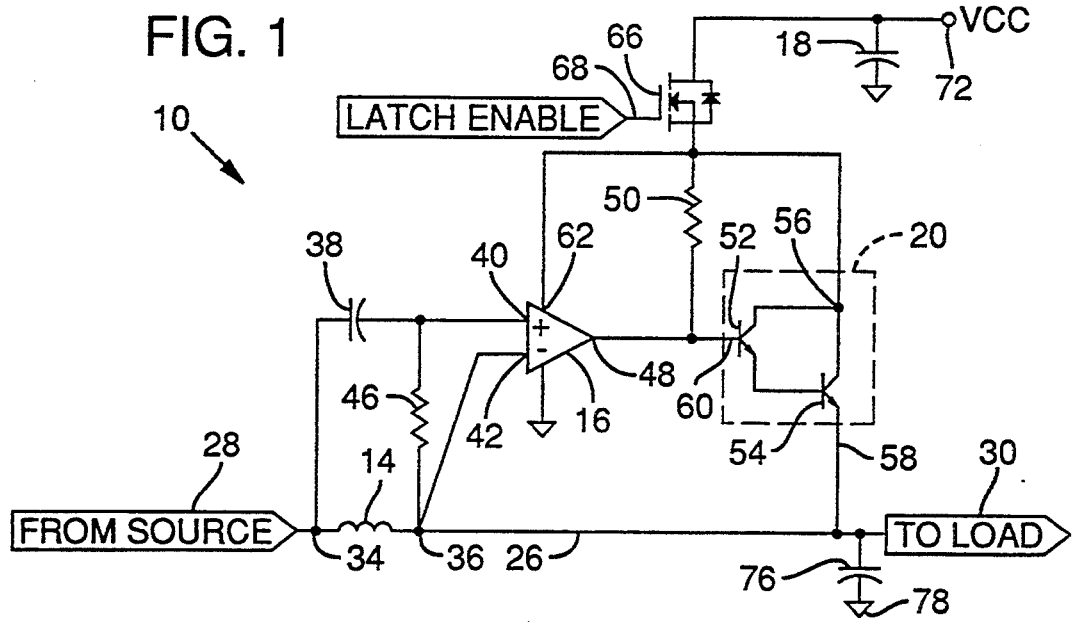
FIG. 1 is a schematic diagram of a current hold, inductance multiplier circuit topology according to a preferred embodiment of the present invention.

With reference to FIG. 1, a current hold, inductance multiplier circuit topology 10 according to a preferred embodiment of the present invention comprises an inductor 14, a voltage comparison means or comparator 16, a storage capacitor 18, and a current driving means or driver 20. The inductor 14 is connected in series with a current path 26 between a current source 28 and a load 30. The inductor 14 has two terminals 34, 36. The first inductor terminal 34 is AC coupled to a noninverting input 40 of the comparator 16 through a capacitor 38. The second inductor terminal 36 is connected to an inverting input 42 of the comparator 16. A biasing resistor 46 is connected between the comparator inputs 40, 42 to maintain a small voltage difference between the inputs, promoting stability of a difference signal produced by the comparator 16 at an output 48. The use of the biasing resistor 46 in the preferred embodiment assumes the comparator 16 has NPN inputs. Depending on the technology type of the comparator 16, various other biasing schemes can be used. The AC coupling of the inductor 14 to the comparator 16 with the capacitor 38 prevents the DC value of the current in the current path 26 from influencing the difference signal. Typical comparator outputs are open-collector requiring a pull-up resistor at the output. A pull-up resistor 50 is therefore connected to the output 48.

The circuit topology 10 can also be implemented with an operational amplifier in place of the comparator 16. In embodiments of the invention where an operational amplifier is used as a voltage comparison means, the input biasing resistor 46 and output pull-up resistor 50 may not be needed.

In accordance with well known properties of inductors, the voltage between the inductor terminals 34, 36 varies proportionately to the change in current through the inductor 14. This property is often expressed mathematically as:

$$V = L \cdot \frac{di}{dt} \qquad (1)$$

where V is the voltage between the inductor terminals, L is the inductance of the inductor, and i is the current through the inductor (the source current). Thus, a change in the magnitude of the source current produces a difference in voltage between the inductor terminals 34, 36. The voltage difference between the terminals is measured by the comparator 16 which generates the difference signal at the output 48 proportional to the voltage difference.

The output 48 of the comparator is connected to the driver circuit 20. In the preferred embodiment, the driver circuit 20 comprises a pair of transistors 52, 54 coupled in a well known Darlington configuration (common collector cascade pair configuration). However, the driver circuit 20 can be implemented using various other forms of output drivers having sufficient gain and power handling capability, including integrated drivers, single and multiple element drivers, and cascaded multiple element drivers in Dartington or other configurations. The driver 20 is powered by the storage capacitor 18 at a collector input 56. An emitter output 58 of the transistor 54 is connected to the load 30. A base input 60 of the transistor 52 is connected to the comparator output 48.

Responsive to the difference signal, the driver 20 drives the load 30 with a current supplied from the storage capacitor (the driver current). Thus, when the amount of source current drawn by the load 30 through the inductor 14 changes, the change in the source current induces a voltage difference between the inductor terminals 34, 36. The voltage difference is detected by the comparator 16 which drives the driver 20 with a difference signal proportional to the voltage difference. In response to the difference signal, the driver 20 varies the driver current provided to the load to correct the source current through the current path 26. This returns the source current to a constant or latched magnitude.

The storage capacitor 18 also supplies power to the comparator 16 at power input 62. Typically, the comparator output 48 is an open-collector output requiring a pull-up resistor for proper operation. Accordingly, a pull-up resistor 50 is connected between the storage capacitor 18 and comparator output 48 through a current switch 66.

The current switch 66 provides a means for selectively enabling and disabling the driver 20 and comparator 16. The current switch 66 has two states, open and closed. In its open state, the current switch 66 disconnects the comparator 16 and the driver 20 from the storage capacitor 18 to disable their operation. In its closed state, the current switch 66 connects the comparator 16 and the driver 20 to the storage capacitor 18 enabling circuit operation. The current switch 66 changes between the states responsive to a latch enable signal received at an input 68. The circuit can thus be selectively enabled to latch the current provided by the source 28 to its magnitude at the time of enablement, and disabled to allow the source current to vary as required by the load 30.

The storage capacitor 18 is charged from a VCC power bus line 72 when the storage capacitor is disconnected from the remainder of circuit 10 by placing the current switch 66 in its open state. In most applications in which the circuit 10 is employed, the VCC power bus line 72 is supplied with a logic high voltage by a switching power supply circuit (not shown) in the load 30.

A capacitor 76 is connected between the load 30 and a ground power bus line 78. The capacitor 76 provides some energy storage for the load and slows the required response time of the current hold circuit 10. Thus, the capacitor 76 has the effect of further smoothing variations of the source current from its latched magnitude.

The duration that the source current can be latched by the circuit is limited by a number of factors. In particular, the duration of source current latching is limited by the amount of energy stored on the storage capacitor 18 and the current requirements of the load 30. The duration is also limited by the ability of the source current to supply sufficient energy to the switching power supply circuit in the load 30 to maintain a logic high voltage on the VCC power bus line 72.

Figure 2:
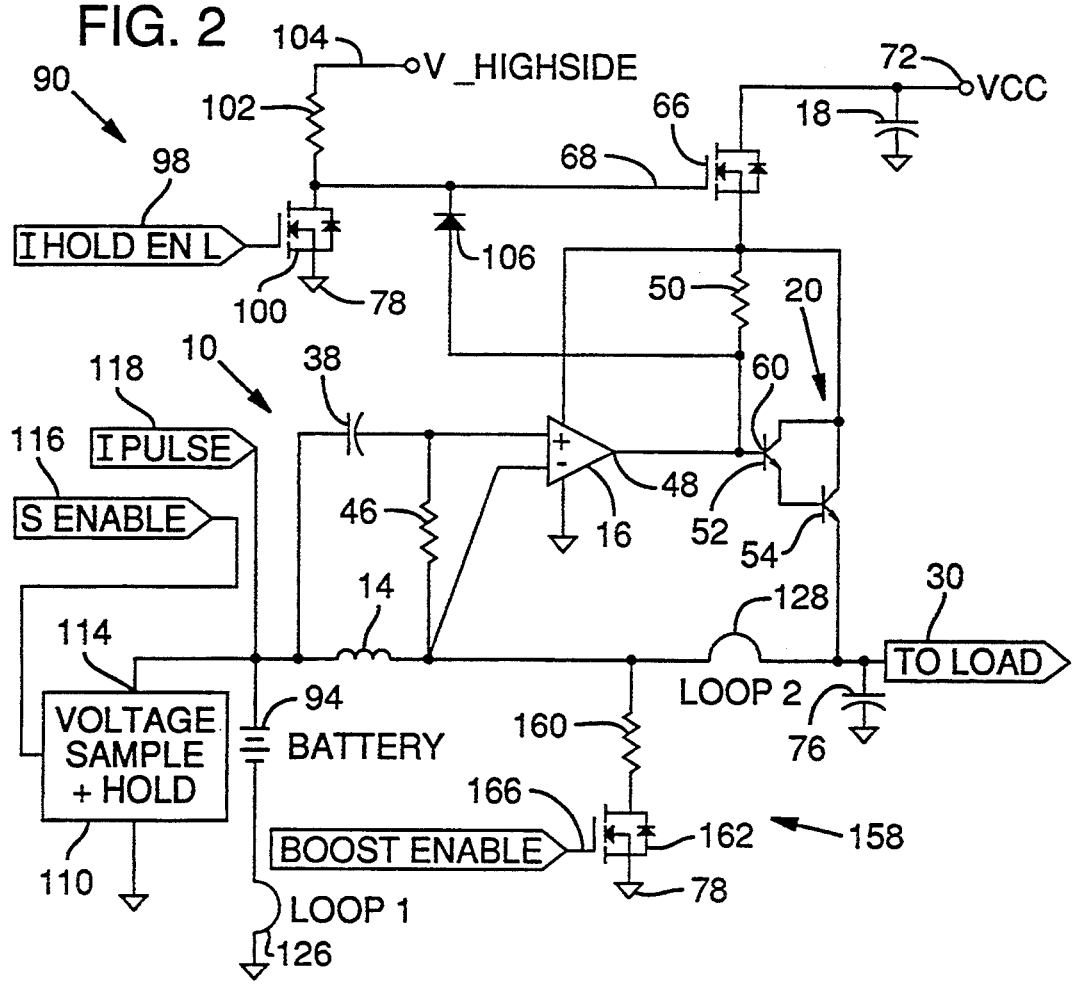
FIG. 2 is a schematic diagram of a battery impedance measurement circuit employing the circuit topology of FIG. 1.

Referring to FIG. 2, the current hold circuit topology 10 is employed by a battery impedance testing circuit 90. The test circuit 90 comprises a battery 94 which provides a source current to a load 30 through the inductor 14 of the current hold circuit 10. The current hold circuit 10 operates as described above to latch the source current to a constant magnitude when enabled.

The current hold circuit 10 is enabled by an active low, current hold enable signal received at an input 98 of a current switch 100. The current switch 100 is connected between the latch enable input 68 of the current switch 66 and the ground power bus line 78. A resistor 102 is connected between a logic high voltage line 104 and the latch enable input 68. A diode 106 is connected between the driver input 60 and the latch enable input 68. The diode 106 operates to turn off the driver 20 by providing a path to ground when the comparator 16 is not powered. When the current hold enable signal is at a logic high voltage, the current switch 100 switches to a closed state, drawing the voltage at the enable input 68 low. This opens the current switch 66 to disable the current hold circuit 10. When the current hold enable signal is asserted low, the current switch 100 is opened, allowing the resistor 102 to pull the voltage at the enable input 68 to a high logic voltage level. This closes the current switch 66 to enable latching operation of the current hold circuit 10.

In order to measure a difference in battery voltage produced by pulsing the battery 94 (the battery voltage delta), a conventional voltage sample and hold circuit 110 is coupled to the battery 94. The voltage sample and hold circuit 110 samples a voltage at a sample input 114 (the battery voltage) responsive to a sample enable signal received on a sample enable line 116.

The test circuit 90 measures the impedance of the battery 94 as follows. The current hold enable signal is asserted low to enable the current hold circuit 10. When the current hold circuit 10 is enabled, the source current drawn by the load through the inductor 14 is latched at a constant magnitude. With the source current latched, a current pulse of known magnitude is applied to the battery 94 at a current pulse input line 118. The voltage sample and hold circuit 110 is operated to measure the difference in battery voltage from before the current pulse is applied to after the current pulse has stabilized (the battery voltage delta). The battery voltage delta is then divided by the magnitude of the current pulse to yield the value of the battery impedance.

The test circuit 90 can be used in a palmtop computer, for example, to measure the impedance of the computer's battery as described above. When the test circuit 90 is used in a palmtop computer, the load 30 of the test circuit 90 includes a switching power supply circuit, microprocessor, memory, and other circuits of the computer. Preferably, the current hold enable and sample enable signals used in the battery impedance measurement process are provided by the computer's microprocessor circuit under software control. The current pulse is generated by a constant current source (not shown) connected to the current pulse input 118 and also enabled by the microprocessor. The microprocessor measures the battery voltage delta sampled by the voltage sample and hold circuit 110 by digitizing the sampled voltage with an analog to digital converter. The microprocessor can then determine the battery impedance by dividing the digitized battery voltage delta by the known magnitude of the current pulse.

For purposes of illustration, two current measurement loops are shown in the test circuit 90 of FIG. 2. A first loop 126 is connected between the battery and ground and measures the magnitude of the current through the battery (the battery current). A second loop 128 is connected between the inductor 14 and the load 30 to measure the source current. The currents through these two loops under various circuit conditions are illustrated in FIG. 4.

With reference to FIG. 4, waveform A is that of a current pulse enable signal 136 for triggering generation of a current pulse by a constant current source connected to the battery at current pulse input 118. The current pulse enable signal has a transition 138 from a logic low voltage to a logic high voltage at a time 140. The transition 138 triggers generation of the current pulse by the constant current source. The constant current source begins generating the current pulse at a time 142 after a short delay. The current pulse stabilizes by a time 144. A high to low transition 146 of the current pulse enable signal occurs at a time 148, ending generation of the current pulse.

Waveforms B and C show the source current flowing through the loop 128 (and the inductor 14). With waveform B, the current hold circuit 10 is disabled by applying a logic high voltage to the current hold enable input 98. With the current hold circuit 10 disabled, the source current is not latched allowing the current pulse to be partially diverted to the load 30. Thus, from shortly after time 142 to shortly after time 144, the source current increases from the diverted current pulse. The source current remains high through the duration of the current pulse due to diversion of the current pulse to the load.

With waveform C, the current hold circuit 10 is enabled concurrently with the current pulse enable signal at the time 140 and disabled at the time 148. Despite the application of the current pulse to the battery 94, the source current remains latched at a substantially constant magnitude while the current hold circuit 10 is enabled. The waveform shows that diversion of the current pulse to the load 30 is prevented by the current hold circuit 10.

Waveforms D, E, and F illustrate the battery current flowing into the battery and through the loop 126. With waveform D, the battery current is measured without the load 30 attached. With no load, the magnitude of the battery current is equal to the magnitude of the current pulse throughout the measurement. As previously described, generation of the current pulse begins at the time 142 and stabilizes by the time 144. This waveform of the battery current is ideal for measuring the impedance of the battery.

With waveform E, the load 30 is attached and the current hold circuit 10 is disabled. With the current hold circuit 10 disabled, the current pulse is partially diverted to the load 30. The current pulse into the battery 94 is degraded from the diversion to the load 30. Therefore, the battery current never matches the full magnitude of the current pulse and is not constant over the duration of the pulse. The battery impedance cannot be accurately measured in these circumstances.

With waveform F, the load 30 is attached and the current hold circuit 10 is enabled and disabled concurrently with the current pulse enable signal transitions 138 and 146 respectively. With the current hold circuit 10 enabled, the current pulse is not diverted to the load 30, and flows into the battery 94. At the time 144 that the current pulse is stabilized, the magnitude of the battery current is that of the current pulse. The battery voltage delta can therefore be measured at the time 144 with the voltage sample and hold circuit 110 to accurately determine the battery impedance as previously described.

Referring again to FIG. 2, the test circuit 90 also includes a boost circuit 158 comprised of a resistor 160 and a current switch 162 connected in series between the inductor terminal 36 and the ground power bus line 78. The current switch 162 changes between an open and a closed state responsive to a boost enable signal received at a boost enable input 166. The boost circuit 158 can be operated to provide extra current to the load 30. When the boost enable signal is applied to the current switch 162, the current switch 162 is closed, increasing the amount of source current flowing through the inductor 14. By applying the boost enable signal before and during latching of the source current with the current hold circuit 10, an increased magnitude of source current is latched by the current hold circuit. After the boosted source current is latched, the boost circuit 158 can be immediately disabled so that the current flowing through the resistor 160 is redirected to the load 30. The boost circuit 158 is disabled by ceasing to apply the boost enable signal, allowing the current switch 162 to change to an open state.

Figure 3:
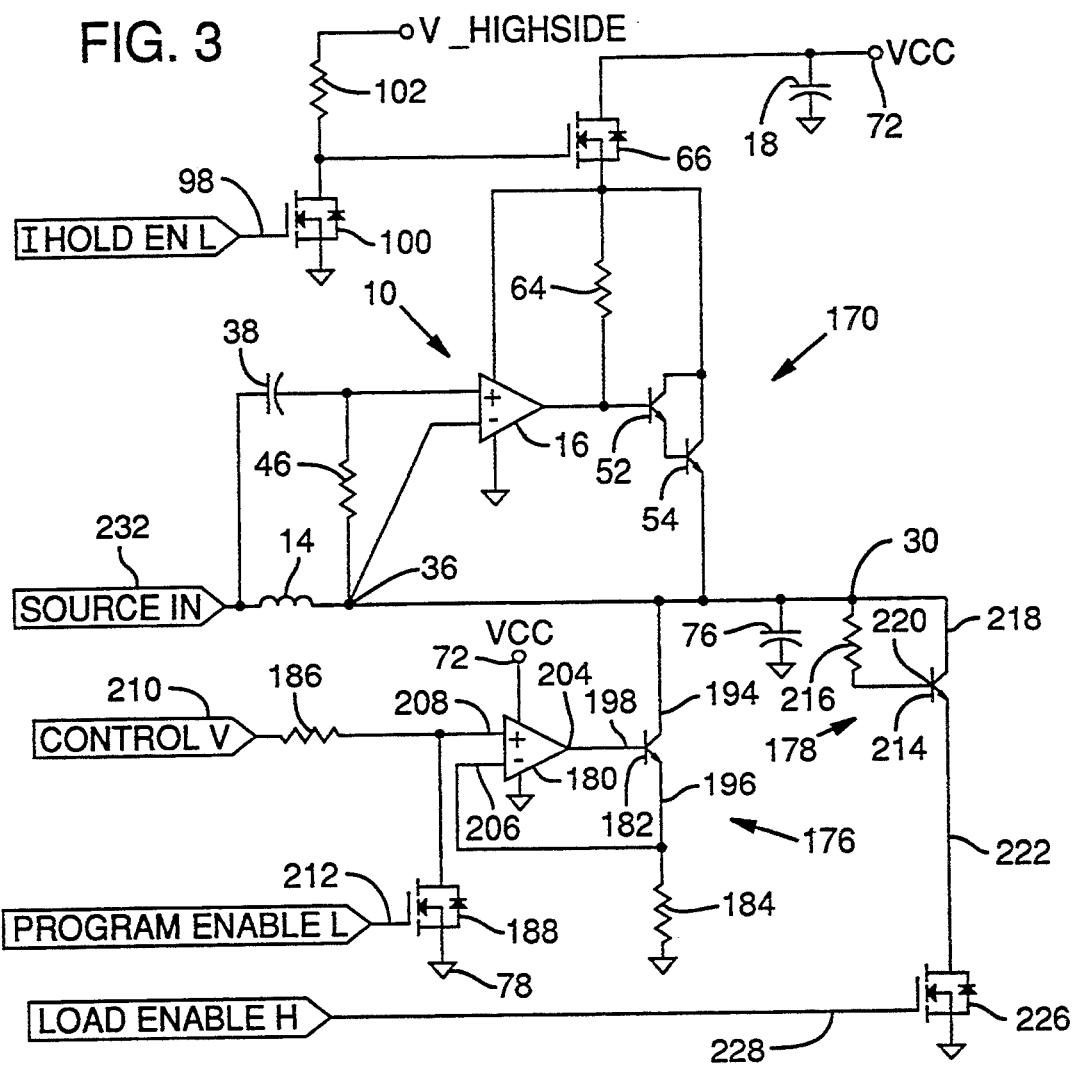
FIG. 3 is a schematic diagram of a programmable current sink employing the circuit topology of FIG. 1.

With reference to FIG. 3, the current hold circuit topology 10 can also be employed in a programmable current sink 170. To form the programmable current sink 170 with the current hold circuit 10, the boost circuit 158 shown in FIG. 2 is replaced with a voltage controlled boost circuit 176 and an active load 178 is connected at the load output 30.

The voltage controlled boost circuit 176 comprises an operational amplifier 180, a bipolar transistor 182, two resistors 184, 186, and a current switch 188. The transistor 182 has a collector 194 connected to the inductor terminal 36, an emitter 196 connected to the resistor 184, and a base 198 connected to an output 204 of the operational amplifier 180. The resistor 184 is connected between the emitter 196 and the ground power bus line 78. The emitter 196 is also connected to an inverting input 206 of the operational amplifier 180. The resistor 186 is connected between a non-inverting input 208 of the operational amplifier and a control voltage input 210. The current switch 188 is connected between the non-inverting input 208 and the ground power bus line 78. The current switch 188 is driven by a program enable signal received at a switch input 212 of the current switch.

The active load 178 is implemented in the illustrated embodiment using a transistor 214 and a resistor 216. The transistor's collector 218 is connected to the load output 30 of the current hold circuit 10. The resistor 216 connects the base 220 of the transistor 214 to the load output 30. The transistor's emitter 222 is coupled through a current switch 226 to ground. The active load is enabled by applying an active high load enable signal to the gate 228 of the current switch 226.

The voltage controlled boost circuit 176 operates to program the magnitude of a source current received at a source input 232 of the programmable current source 170. To program the source current, the active load 178 is first disabled by asserting the load enable signal at the gate 228 of the current switch 226 to a logic low voltage. With the load disabled, only the boost circuit 176 can draw current from the source input 232. Thus, the magnitude of the source current can be set by programming the magnitude of the current drawn by the boost circuit 176.

The current drawn by the boost circuit 176 is programmed by applying a control voltage at the control voltage input 210 proportional to the desired magnitude of the source current. The control voltage may be provided, for example, by a digital to analog converter (not shown) which generates the control voltage based on a user or computer selected digital value. When the program enable signal at the switch input 212 is at a logic high voltage, the current switch 188 is closed, shunting the control voltage through the resistor 186 to ground. By asserting the program enable signal low, the current switch 188 changes to an open state, allowing the control voltage to drive the non-inverting input of the operational amplifier 180. The operational amplifier 180 amplifies the control voltage and drives the transistor 182 with the amplified control voltage. When driven with a voltage, the transistor 182 allows a boost current to flow from the inductor terminal 36 through the resistor 184 that is proportional to the amplified control voltage at its emitter 196, divided by the resistance of the resistor 184. Thus, by properly selecting the magnitude of the control voltage, the magnitude of the boost current is programmed.

With the magnitude of the source current set equal to the programmed boost current, the current hold circuit 10 is enabled to latch the source current to that magnitude. The latched source current can then be applied to the active load 178 by simultaneously disabling the boost circuit 176 and enabling the active load 178. In this manner, the programmable current sink 170 operates to draw a programmed magnitude of current at its source input 232.

Figure 5:
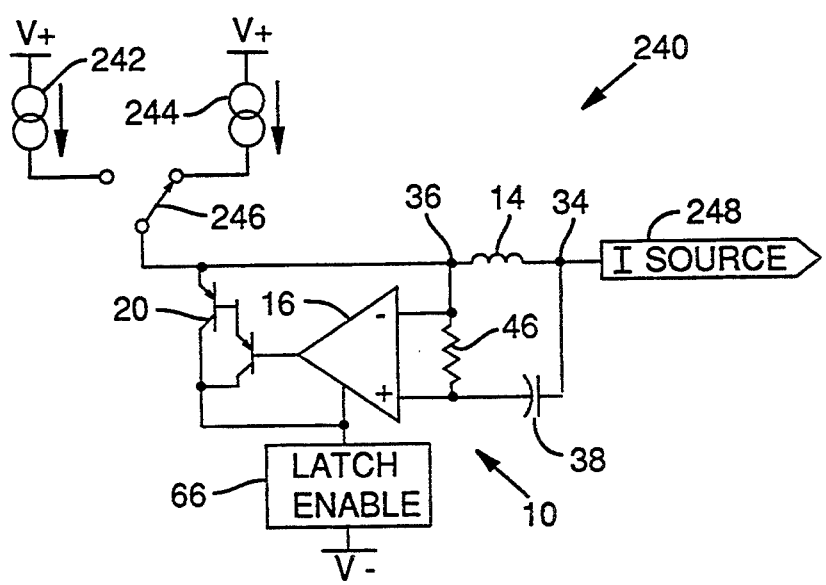
FIG. 5 is a schematic diagram of a programmable current source employing the circuit topology of FIG. 1.
Figure 4A:
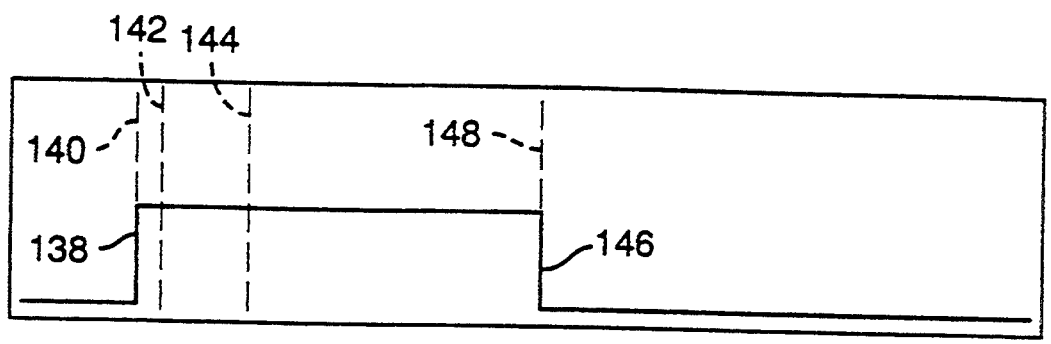
FIG. 4 is a waveform diagram of currents in the circuit of FIG. 2.
Figure 4B:
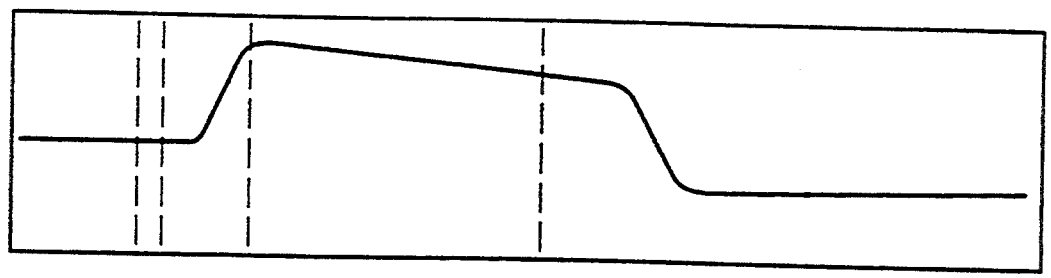
Figure 4C:
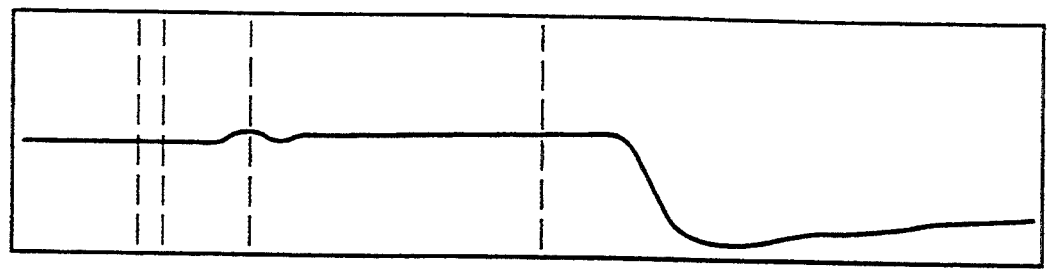
Figure 4D:
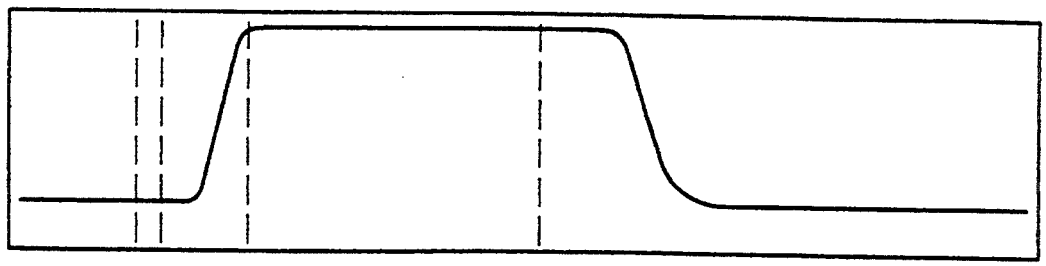
Figure 4E:
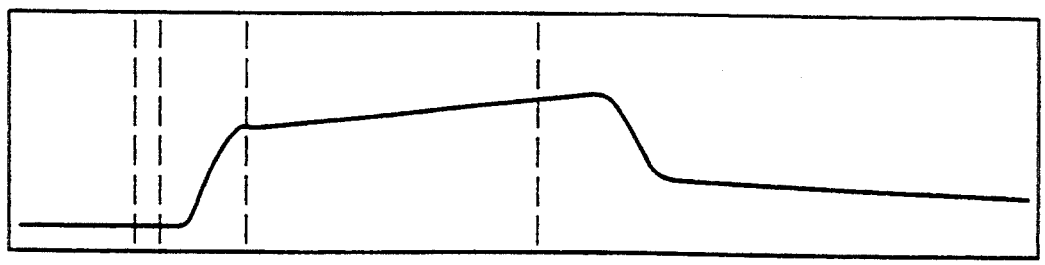
Figure 4F:
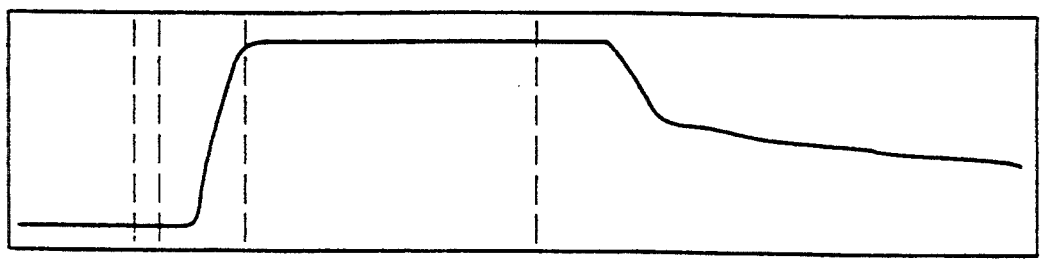

As shown in FIG. 5, the current hold circuit 10 can also be used to implement a programmable current source 240 by inverting the circuit topology of the programmable current sink 170 (FIG. 3) to provide a source current at a programmed magnitude rather than draw such a current. In the programmable current source 240, current flows from one of the current sources 242, 244 coupled by a switch 246 to the inductor terminal 36, through the inductor 14, and to a current source output 248 connected to the inductor terminal 34. The switch 246 operates to connect one or the other of the current sources 242, 244 to the inductor 14.

The current source 244 provides a pulsed programming current of a selected magnitude and can be implemented similarly to the boost circuit 176 (FIG. 3). The magnitude of the source current provided at the output 248 is set by disabling the current hold circuit 10 and connecting the current source 244 to the inductor 14 with the switch 246. The source current magnitude is then equal to the selected magnitude of the pulsed programming current. The source current can be maintained at the selected magnitude by enabling the current hold circuit 10 to latch the source current at the selected magnitude. The switch 246 can then be operated to connect the inductor 14 to the current source 242 which is an uncontrolled source of current. The current hold circuit 10 continues to maintain the source current at the latched magnitude by diverting any excess current to the driver 20 and away from the inductor 14.

The current hold circuit topology 10 shown in FIG. 1 has numerous possible applications in addition to those described above. For example, the circuit topology 10 also has application as a source impedance converter. When connected to a power source or supply, the circuit 10 operates to change the input impedance of the circuit. More specifically, when the circuit 10 is disabled by applying a logic low voltage at the switch input 68, the impedance through the current path 26 is low, equal only to that of the inductor 14. However, when the circuit 10 is enabled by applying a logic high voltage at the switch input 68, the impedance of the current path 26 is very high. This high impedance effect is achieved because, when the circuit 10 is enabled, the voltage difference between the source input 28 and load output 30 can increase substantially while the source current is maintained substantially unchanged. Thus, the input impedance, which is equal to the voltage difference divided by the change in the source current, is very high.

A further application of the circuit topology 10 shown in FIG. 1 is that of a current mode low pass filter. In a current mode low pass filter, the current hold circuit 10 is used to latch a current through the current path 26 at successive uniform time intervals. The successive latching of the current has an averaging effect on the current, effectively passing only very low frequencies (i.e., essentially a DC-pass filter).

A still further application of the circuit topology 10 is as a surge protector. In a surge protector application, the current hold circuit 10 is enabled on detection of a power surge to hold the source current at or below a maximum current magnitude for the duration of the power surge. The power surge can be detected, for example, by comparison of the voltage difference between the inductor terminals 34, 36 to a maximum threshold voltage. A power surge causes a rapid increase in the source current which, in turn, results in a voltage difference greater than the maximum threshold voltage. When the voltage difference exceeds the maximum threshold voltage, a current hold enabling signal is generated to enable the circuit 10 and prevent the source current from exceeding the maximum current magnitude.

A further application of the circuit topology 10 is as a power drop-out or brown-out protector. In such an application, the current hold circuit 10 is enabled upon detection of a power drop-out or brown-out to maintain the current above a minimum current necessary for operation of the load 30. For the circuit 10 to supply adequate protection, sufficient energy must be stored in the storage capacitor 18 to supply the load 30 for the duration of the power drop-out or for a graceful power-down of the load 30. The circuit 10 could be used, for example, to maintain sufficient current to a portable computer to permit storing data from volatile electronic memory into non-volatile disk storage when the power is interrupted.

Having described and illustrated the principles of my invention with reference to a preferred embodiment and several variations thereof, it will be recognized that the invention can be modified in arrangement and detail without departing from such principles. Accordingly, I claim as my invention all such embodiments as may come within the scope and spirit of the following claims and equivalents thereto.

I claim:

1. A circuit comprising:
   an inductor having a first terminal for connecting to a current source and a second terminal for connecting to a load to conduct a first current from the current source to the load, the inductor producing a voltage drop related to a change in the first current; and
   current driving means coupled to the inductor for providing a second current to the load responsive to the voltage drop whereby the first current is maintained at a substantially constant current magnitude.

2. The circuit of claim 1 further comprising a comparator having a first input connected to the first inductor terminal, a second input connected to the second inductor terminal, and an output connected to the current driving means, the comparator producing at the output a difference signal related to the voltage drop.

3. The circuit of claim 1 further comprising an operational amplifier having a first input connected to the first inductor terminal, a second input connected to the second inductor terminal, and an output connected to the current driving means, the operational amplifier producing at the output a difference signal related to the voltage drop.

4. The circuit of claim 1 wherein the driving means comprises a storage capacitor and a driver circuit.

5. The circuit of claim 1 further comprising means for selectively enabling and disabling the current driving means.

6. A circuit for maintaining a constant current through a current path, comprising:
   an inductor connected in series with a current path between a current source and a load, the inductor having a first terminal coupled to the current source and a second terminal coupled to the load;
   a storage capacitor; and
   a driver coupled to the inductor and connected to the capacitor, the driver being supplied by the storage capacitor to drive the load with an additional current related to a voltage drop between the terminals of the inductor such that the current through the current path is maintained substantially constant.

7. The circuit of claim 6 further comprising:
   comparison means having a first input terminal coupled to the first inductor terminal and a second input terminal coupled to the second inductor terminal for detecting the voltage drop between the inductor terminals, the comparison means having an output terminal connected to the driver for controlling the driver with a difference signal related to the voltage drop.

8. The circuit of claim 7 wherein the first input terminal is coupled to the first inductor terminal with a capacitor.

9. The circuit of claim 7 wherein the comparison means comprises a comparator.

10. The circuit of claim 9 further comprising a biasing resistor connected between the first and second input terminals and a pull-up resistor connected between the output terminal and the storage capacitor.

11. The circuit of claim 10 wherein the driver comprises a pair of transistors connected in a Darlington configuration.

12. The circuit of claim 6 further comprising an enabling switch connected between the storage capacitor and the driver, the switch changing states responsive to an enable signal between an open state wherein the storage capacitor is disconnected from the driver and a closed state wherein the storage capacitor is connected and provides energy to the driver.

13. The circuit of claim 6 further comprising a load capacitor connected to the second inductor terminal.

* * * * *